US010895805B2

(12) United States Patent
Kohmura et al.

(10) Patent No.: US 10,895,805 B2
(45) Date of Patent: Jan. 19, 2021

(54) PELLICLE MANUFACTURING METHOD AND METHOD FOR MANUFACTURING PHOTOMASK WITH PELLICLE

(71) Applicants: MITSUI CHEMICALS, INC., Tokyo (JP); TAZMO CO., LTD., Okayama (JP)

(72) Inventors: Kazuo Kohmura, Chiba (JP); Daiki Taneichi, Otake (JP); Yosuke Ono, Sodegaura (JP); Hisako Ishikawa, Ichihara (JP); Tsuneaki Biyajima, Otake (JP); Yasuyuki Sato, Ibara (JP); Toshiaki Hirota, Ibara (JP)

(73) Assignees: MITSUI CHEMICALS, INC., Tokyo (JP); TAZMO CO., LTD., Okayama (JP)

( * ) Notice: Subject to any disclaimer, the term of this patent is extended or adjusted under 35 U.S.C. 154(b) by 240 days.

(21) Appl. No.: 15/794,420

(22) Filed: Oct. 26, 2017

(65) Prior Publication Data

US 2018/0046071 A1 Feb. 15, 2018

Related U.S. Application Data

(63) Continuation of application No. PCT/JP2016/061730, filed on Apr. 11, 2016.

(30) Foreign Application Priority Data

Apr. 27, 2015 (JP) ................................ 2015-090780

(51) Int. Cl.
*G03F 1/62* (2012.01)
*G03F 1/60* (2012.01)
(Continued)

(52) U.S. Cl.
CPC .................. *G03F 1/62* (2013.01); *G03F 1/60* (2013.01); *G03F 1/64* (2013.01); *C09J 7/38* (2018.01); *G03F 1/80* (2013.01)

(58) Field of Classification Search
CPC .................. G03F 1/64; G03F 1/62; G03F 1/60
See application file for complete search history.

(56) References Cited

U.S. PATENT DOCUMENTS 5,793,836 A * 8/1998 Maldonado ............... G03F 1/22
378/35
5,814,381 A * 9/1998 Kuo ......................... G03F 1/64
428/14

(Continued)

FOREIGN PATENT DOCUMENTS

EP 3 007 206 A1 4/2016
JP 5-109889 A 4/1993
(Continued)

OTHER PUBLICATIONS

International Search Report (PCT/ISA/210) dated Jun. 21, 2016, by the Japanese Patent Office as the International Searching Authority for International Application No. PCT/JP2016/061730.
(Continued)

*Primary Examiner* — Daborah Chacko-Davis
(74) *Attorney, Agent, or Firm* — Buchanan, Ingersoll & Rooney PC

(57) ABSTRACT

A method for producing a pellicle according to the one embodiment of the present invention produces a pellicle including a pellicle film and a pellicle frame supporting an outer peripheral portion of the pellicle film. The method includes forming the pellicle film on a substrate, and bonding a pressure-sensitive adhesive sheet, that is elastic and has a pressure-sensitive adhesive force thereof decreased upon receipt of external stimulation, to each of two surfaces of the substrate; making a notch inside a part of the substrate, the
(Continued)

part having the pressure-sensitive adhesive sheets bonded thereto; separating a substrate outer peripheral portion outer to the notch of the substrate, in a state where the pressure-sensitive adhesive sheets are bonded to the substrate, to form a pellicle frame; and stimulating the pressure-sensitive adhesive sheets to peel off the pressure-sensitive adhesive sheets.

20 Claims, 10 Drawing Sheets

(51) Int. Cl.
*G03F 1/64* (2012.01)
*C09J 7/38* (2018.01)
*G03F 1/80* (2012.01)

(56) References Cited

U.S. PATENT DOCUMENTS

| | | | |
|---|---|---|---|
| 6,593,035 B1 * | 7/2003 | Levinson | G03F 1/62 428/14 |
| 9,703,187 B2 | 7/2017 | Ono et al. | |
| 2007/0128834 A1 | 6/2007 | Nakamura | |
| 2011/0081603 A1 | 4/2011 | Shirasaki et al. | |
| 2011/0132258 A1 | 6/2011 | Nagata | |
| 2013/0065160 A1 | 3/2013 | Lao | |
| 2013/0065164 A1 | 3/2013 | Nagata | |
| 2016/0147141 A1 | 5/2016 | Ono et al. | |

FOREIGN PATENT DOCUMENTS

| | | |
|---|---|---|
| JP | 2000-292909 A | 10/2000 |
| JP | 2007-157887 A | 6/2007 |
| JP | 2013-004893 A | 1/2013 |
| KR | 10-2011-0036661 A | 4/2011 |
| KR | 10-2011-0065364 A | 6/2011 |
| KR | 10-2013-0005219 A | 1/2013 |
| KR | 10-2013-0028659 A | 3/2013 |
| TW | 201502696 A | 1/2015 |
| WO | WO 2014/188710 A1 | 11/2014 |

OTHER PUBLICATIONS

Written Opinion (PCT/ISA/237) dated Jun. 21, 2016, by the Japanese Patent Office as the International Searching Authority for International Application No. PCT/JP2016/061730.

* cited by examiner

PELLICLE MANUFACTURING METHOD AND METHOD FOR MANUFACTURING PHOTOMASK WITH PELLICLE

CROSS REFERENCE TO RELATED APPLICATIONS

This application is based upon and claims the benefit of priority from the prior Japanese Patent Application No. 2015-090780, filed on Apr. 24, 2015, and PCT Application No. PCT/JP2016/061730, filed on Apr. 11, 2016, the entire contents of which are incorporated herein by reference.

FIELD

The present invention relates to a method for producing a pellicle.

BACKGROUND

For producing a semiconductor device such as an LSI, a VLSI or the like, or a liquid crystal display panel or the like, patterning is performed by exposure through a photomask or a reticle. In the case where a foreign object is attached to a surface of the photomask or the reticle, the foreign object is transferred to a wafer each time the exposure to light is performed. In order to avoid this, a pellicle including a pellicle frame and a pellicle film is bonded such that the pellicle film is located several millimeters away from a surface of the photomask of the reticle. In the case where the pellicle is located on at least a patterned surface of the photomask or the reticle, the foreign object attached to a surface of the pellicle is not focused on. Therefore, an image of the foreign object is not formed on a photoresist formed on the semiconductor wafer, and thus the circuit pattern is prevented from being defective.

Such a pellicle-attached photomask is conventionally produced as follows. A pellicle frame having a shape corresponding to the photomask or the reticle and a thickness of about several millimeters is prepared. A pellicle film formed of a transparent polymer film of nitrocellulose or a cellulose derivative having a thickness of 10 μm or less is stretched on, and bonded to, one of two surfaces of the pellicle frame. Then, the other surface of the pellicle frame is bonded to the surface of the photomask or the reticle via an adhesive material.

A wavelength of light usable for lithography has become shorter and shorter, and EUV lithography has been developed as a next generation lithography technology. The "EUV light" refers to light having a wavelength in a soft X-ray region or a vacuum ultraviolet region, more specifically, to light having a wavelength of approximately 13.5 nm±0.3 nm. In photolithography, the resolution limit of patterning is about ½ of the wavelength of light used for exposure, and is considered to be about ¼ of the wavelength of light used for exposure even in the case where a liquid immersion method is used. The wavelength of light used for exposure is expected to be about 45 nm at the minimum even when a liquid immersion method with ArF laser (wavelength: 193 nm) is used. In such a situation, the EUV lithography is expected as a revolutionary technology realizing significant size reduction over the conventional lithography technology.

EUV light is easily absorbed to any type of substance and thus, in EUV lithography, exposure to light needs to be performed in a vacuum exposure device. Therefore, attachment of a pellicle to a photomask has been considered as not being indispensable. However, the EUV lithography is a process of high precision that has not been provided conventionally, and the number of times of stacking is larger. For these reasons, it is concerned in the semiconductor industry that LSIs or the like may not be produced at high yield in the case where merely the inside of the device is cleaned. It has been made clear that attachment of a pellicle to a photomask is indispensable. As described above, EUV light is easily absorbed to any type of substance. Therefore, in order to have a sufficiently high level of transmittance for EUV light, the pellicle film included in the pellicle needs to have a thickness of a nanometer order. For example, in the case where the wavelength of the EUV light is 13.5 nm±0.3 nm, the pellicle film needs to have a thickness of 10 nm or greater and 50 nm or less in order to have a transmittance of 90.0% or higher.

For realizing this, it is conceivable that, for example, a pellicle film is formed on a substrate by vapor deposition and the substrate is back-etched to have a frame shape, so that the pellicle film is exposed. In this manner, a pellicle including a pellicle film is provided. However, with this method, the substrate needs to be trimmed (cut) to provide a part thereof that is required to form the pellicle, in order to match the shape of the pellicle to the shape of the photomask or the reticle. Since the pellicle film is very thin, it is preferable that the trimming is performed such that the part of the substrate that is required to form the pellicle is kept on an outer peripheral portion of the pellicle film, in consideration of the ease of handling. The part of the substrate left on the outer peripheral portion of the pellicle film as a result of the trimming is used as a part of the pellicle frame. The back-etching is described in Japanese Laid-Open Patent Publication No. 2013-004893. Japanese Laid-Open Patent Publication No. 2013-004893 describes the following. A silicon substrate of an SOI structure is thinned to have a thickness of 50 μm, and a honey-comb structure is formed by DRIE (Deep Reactive Ion Etching) to form a pellicle film. Then, the pellicle film is cut have the same size as that of the pellicle frame. As described in this publication, the substrate needs to be trimmed (cut) to provide a part thereof that is required to form the pellicle, in order to match the shape of the pellicle to the shape of the photomask or the reticle.

According to a method for trimming to provide a portion that is required to form a pellicle, the substrate is cut by a mechanical force to provide a pellicle frame. However, this method has a problem that after the substrate is cut to provide the pellicle frame, foreign object particles are generated at the cut surface and attached to the pellicle film, which results in contaminating the pellicle film.

SUMMARY

An embodiment according to the present invention provides a method for producing a pellicle including a pellicle film and a pellicle frame supporting an outer peripheral portion of the pellicle film. The method comprises forming the pellicle film on a substrate, and bonding a pressure-sensitive adhesive sheet to each of two surfaces of the substrate, the pressure-sensitive adhesive sheet being elastic and having a pressure-sensitive adhesive force thereof decreased upon receipt of external stimulation; making a notch inside a part of the substrate, the part having the pressure-sensitive adhesive sheets bonded thereto; separating a substrate outer peripheral portion outer to the notch of the substrate, in a state where the pressure-sensitive adhesive sheets are bonded to the substrate, to form a pellicle frame;

and stimulating the pressure-sensitive adhesive sheets to peel off the pressure-sensitive adhesive sheets.

The method for producing a pellicle may further comprising etching the substrate, from a surface opposite to a surface on which the pellicle film is formed, to expose the pellicle film.

After the substrate is etched, from a surface opposite to a surface on which the pellicle film is formed, to expose the pellicle film, the pressure-sensitive adhesive sheet may be bonded to each of the two surfaces of a portion of the substrate that is around the exposed portion of the pellicle film.

The substrate may include a bridge portion coupling the pellicle frame and the substrate outer peripheral portion to each other; and making the notch inside the substrate may be making a notch inside the bridge portion.

The pressure-sensitive adhesive sheets may be bonded to cover both of two surfaces and both of two side surfaces of the bridge portion.

The bridge portion may be connected to each of four corners of the pellicle frame.

The notch may be made inside the substrate by stealth dicing.

The pressure-sensitive adhesive sheets may be antistatic.

For separating the substrate outer peripheral portion to form the pellicle frame, gas in a portion along which the substrate is separated may be absorbed by an absorption device.

An embodiment according to the present invention provides a method for producing a pellicle-attached photomask, comprising joining the pellicle produced by the method for producing a pellicle according to any one of the above, and a photomask, to each other via a frame body attached to the pellicle frame.

A method for producing a pellicle according to the present invention suppresses foreign object particles generated at the time of trimming from being attached to a pellicle film.

DESCRIPTION OF EMBODIMENTS

Figure 1A:
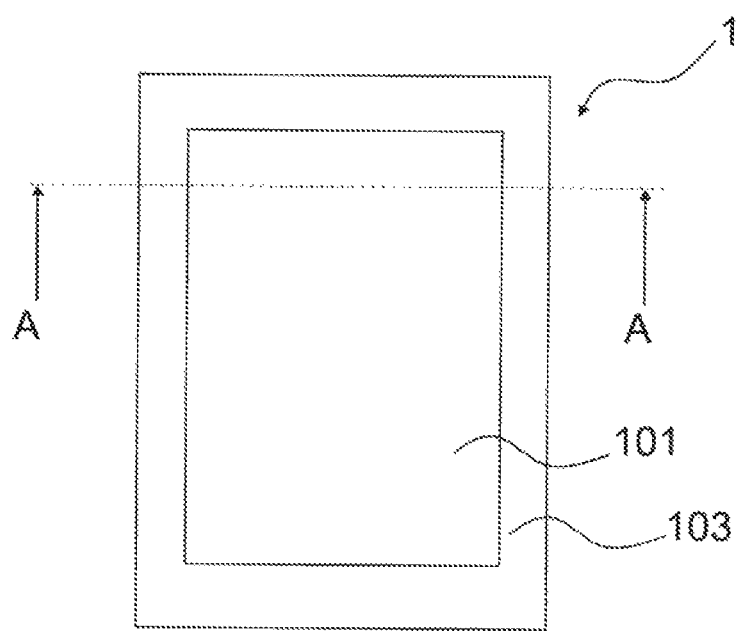
FIG. 1A is a schematic view (plan view) of a pellicle-attached photomask produced in embodiment 1 according to the present invention.

Hereinafter, a method for producing a pellicle-attached photomask according to the present invention will be described with reference to the drawings. The method for producing a pellicle-attached photomask according to the present invention may be carried out in many different forms, and is not construed as being limited to the embodiments described below. In the drawings referred to in the following embodiments, same portions or portions having substantially the same functions bear the identical reference signs, and detailed descriptions thereof will be omitted. For the sake of illustration, the ratio of sizes (ratio of sizes of different components, ratio of sizes in the length direction, the width direction and the height direction, etc.) in the drawings may be different from the actual ratio of sizes, or a part of the components may be omitted from the drawings.

Embodiment 1

[Structure of the Pellicle-Attached Photomask]

Figure 1B:
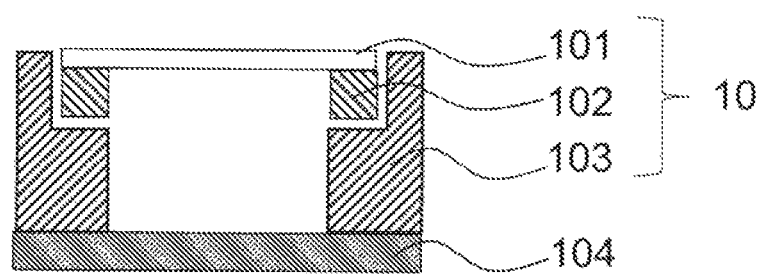
FIG. 1B is a cross-sectional view of the pellicle-attached photomask in embodiment 1 according to the present invention, taken long line A-A in FIG. 1A.

FIG. 1A is a schematic view (plan view) of a pellicle-attached photomask produced in embodiment 1. FIG. 1B is a cross-sectional view of the pellicle-attached photomask in embodiment 1, taken along line A-A in FIG. 1A. The pellicle-attached photomask 1 includes a pellicle 10 and a photomask 104. The pellicle 10 is attached to a patterned surface of the photomask 104. The pellicle 10 includes a pellicle film 101, a pellicle frame 102 and a frame body 103.

Specific examples of compound usable to form the pellicle film 101 include polymer compounds such as fluorine-based polymers, polyolefin, polyimide and the like; metal materials such as ruthenium, nickel, zirconium, titanium, molybdenum, niobium and the like; crystalline silicon (e.g., single crystalline silicon, polycrystalline silicon, etc.); amorphous silicon; diamond-like carbon (DLC); graphite; amorphous carbon; graphene; silicon carbide; silicon nitride; and the like.

The pellicle film 101 may include an anti-oxidant film or a heat dissipation film. The anti-oxidant film is formed of, for example, $SiO_x$ ($x \leq 2$), $Si_xN_y$ ($x/y=0.7$ to $1.5$), SiON, SiC, $Y_2O_3$, YN, Mo, Ru, Rh, or the like.

The heat dissipation film is preferably formed of a material having a high heat radiation ratio or a material having a high heat conductivity. Specifically, the heat dissipation film may be formed of, for example, substantially the same material as that of the anti-oxidant film, Rb, Sr, Y, Zr, Nb, graphite, graphene, or the like. The anti-oxidant film and the heat dissipation film may be formed on one surface, or both of two surfaces, of the pellicle film 101. The pellicle film 101 may contain one of, or two or more of, the above-listed elements and compounds.

The pellicle-attached photomask 1 includes the pellicle 10 and the photomask 104. The pellicle 10 includes the pellicle film 101, the pellicle frame 102 and the frame body 103. The pellicle frame 102 is formed of silicon and has a thickness of about 0.7 mm, and supports an outer peripheral portion of the pellicle film 101.

The frame body 103 is located between the photomask 104 and the pellicle frame 102. In this example. the thickness of the frame body 103 is determined such that the pellicle film 101 and the photomask 104 are away from each other by an interval of about 2 mm. The frame body 103 is joined to the photomask 104 and the pellicle frame 102 with an adhesive layer. An air hole communicating a space formed between the photomask 104 and the pellicle film 101, and the external space, to each other may be provided in the pellicle frame 102 or the frame body 103.

[Method for Producing the Pellicle-Attached Photomask]

Figure 2A:
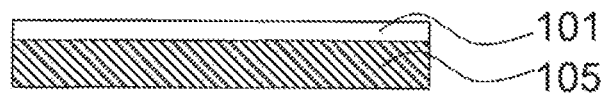
FIG. 2A is a schematic view showing a step of a method for producing the pellicle-attached photomask in embodiment 1.

A pellicle-attached photomask in this embodiment may be produced, for example, as described below with reference to FIG. 2A through FIG. 2E. The production method described below is an example. FIG. 2A through FIG. 2E are schematic views each showing a step of the method for producing the pellicle-attached photomask in an embodiment. A substrate 105 is prepared, and the pellicle film 101 is formed on the substrate 105 (FIG. 2A). The substrate 105 is to become the pellicle frame 102 in a state where the production of the pellicle 10 is finished. The substrate 105 may be, for example, a silicon substrate, a sapphire substrate, a silicon carbide substrate or the like, but is not limited to any of these.

There is no specific limitation on the thickness of the substrate 105. In the case where, for example, the substrate is a silicon substrate, an 8-inch wafer having a thickness of 725 µm conformed to the SEMI standards is preferably usable. In order to perform back-etching described below efficiently, a thinner substrate may be used. A substrate having a thickness of 50 µm or greater may be preferably used without being broken when the pellicle film is formed.

The pellicle film 101 is formed on the substrate 105 by vapor deposition so as to have a thickness of 10 nm or greater and 50 nm or less. EUV light is easily absorbed to any type of substance. Therefore, the pellicle film 101 has, for example, a transmittance of 90% or higher for light having a wavelength of 13.5±0.3 nm.

Figure 2B:
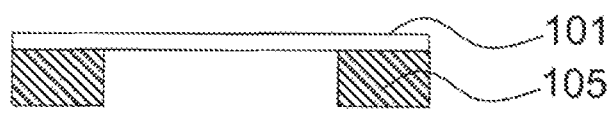
FIG. 2B is a schematic view showing a step of the method for producing the pellicle-attached photomask in embodiment 1.

The substrate 105 having the pellicle film 101 formed thereon is etched from a surface opposite to the surface on which the pellicle film 101 is formed (back-etched), and the pellicle film 101 is exposed such that the substrate 105 is frame-shaped (FIG. 2B). The back-etching may be dry etching or wet etching.

Figure 2C:
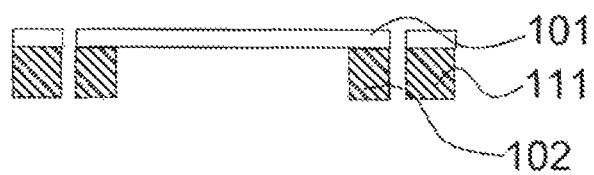
FIG. 2C is a schematic view showing a step of the method for producing the pellicle-attached photomask in embodiment 1.

The back-etched substrate 105 is trimmed to separate a substrate outer peripheral portion 111 thereof to provide the pellicle frame 102, which needs to be joined with the frame body 103 (FIG. 2C). The method for the trimming will be described below in detail with reference to FIG. 3A, FIG. 3B, and FIG. 4A through FIG. 4D. In FIG. 2A through FIG. 2E, the trimming is performed to provide the pellicle frame 102 after the back-etching. Alternatively, the back-etching may be performed after the trimming.

Figure 2D:
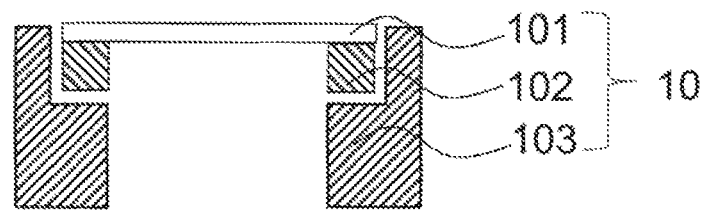
FIG. 2D is a schematic view showing a step of the method for producing the pellicle-attached photomask in embodiment 1.

The frame body 103 is joined with a surface of the pixel frame 102 opposite to a surface on which the pellicle film 101 is located (FIG. 2D).

It is preferable that the frame body 103 is formed of a material that is tolerable against EUV light, is made flat easily and has a low rate of ion elution. It is also preferable that the frame body 103 is formed of a material tolerable against hydrogen radical because hydrogen gas is supplied to the inside of the exposure device in order to remove contaminants derived from carbon.

There is no specific limitation on the material of the frame body 103. The frame body 103 may be formed of a material that is usually usable for a pellicle frame. Specific examples of material usable for the frame body 103 include aluminum, aluminum alloys (5000-type, 6000-type, 7000-type, etc.), stainless steel, silicon, silicon alloys, iron, iron alloys, carbon steel, tool steel, ceramics, metal-ceramic composite materials, resins and the like. Among these materials, aluminum and aluminum alloys, which are lightweight and rigid, are more preferable. The frame body 103 may have a protective film formed on a surface thereof.

The protective film is preferably tolerable against hydrogen radical present in an exposure atmosphere and against EUV light. The protective film is, for example, an oxide film. The oxide film may be formed by a known method such as anodization or the like.

Figure 2E:
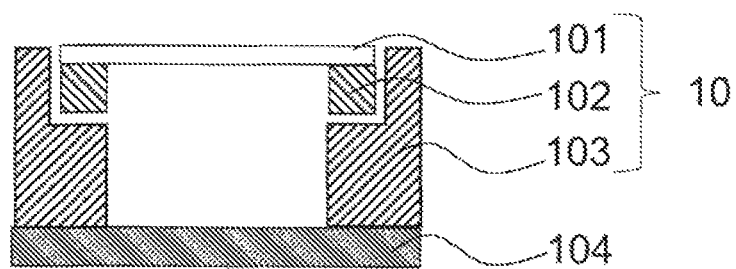
FIG. 2E is a schematic view showing a step of the method for producing the pellicle-attached photomask in embodiment 1.

The pellicle 10 including the pellicle film 101, the pellicle frame 102 and the frame body 103 obtained as a result of the trimming is joined with the photomask 104 (FIG. 2E). At this step, the pellicle-attached photomask 1 is produced.

[Details of the Trimming Method]

Figure 3A:
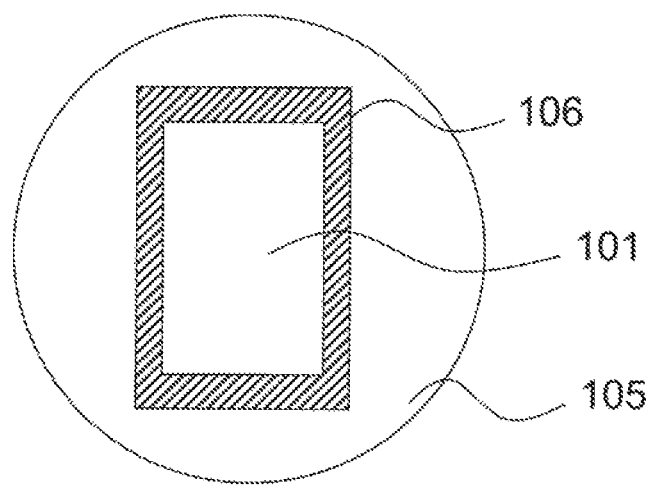
FIG. 3A is a plan view showing a position at which a pressure-sensitive adhesive sheet is bonded in embodiment 1.
Figure 3B:
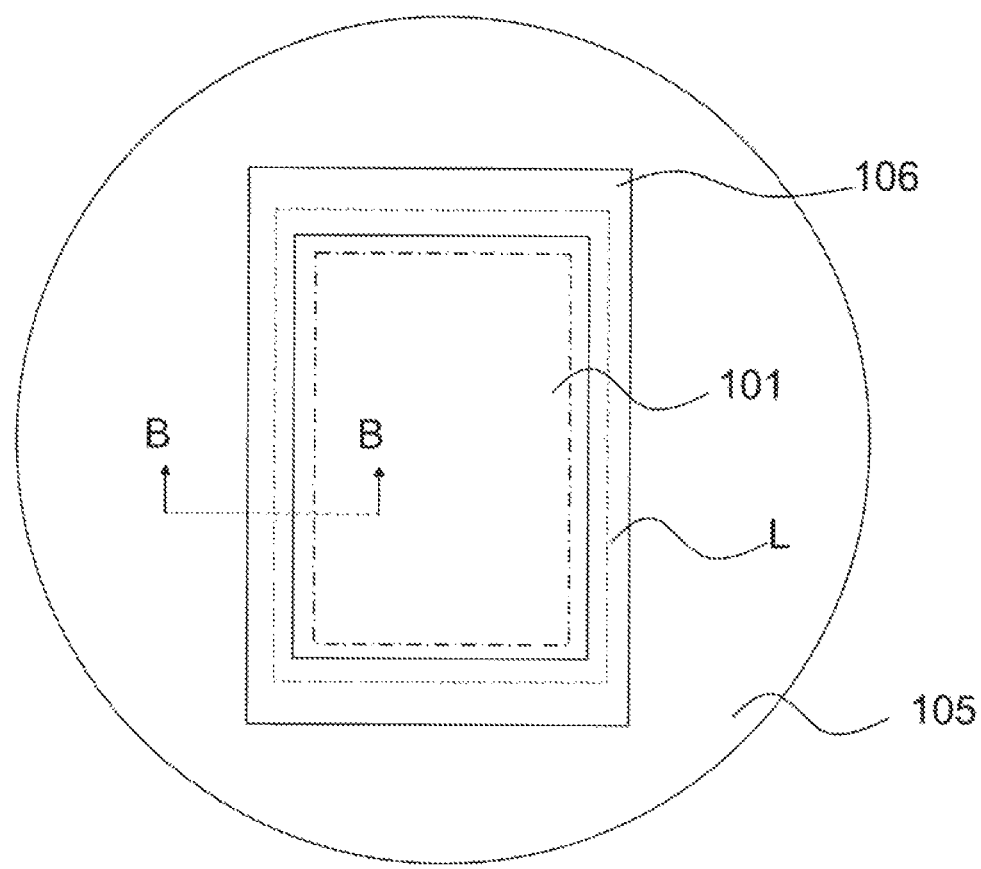
FIG. 3B is an enlarged view of FIG. 3A, showing a portion to be subjected to trimming.

FIG. 3A is a plan view showing a position at which a pressure-sensitive adhesive sheet is bonded in embodiment 1 according to the present invention. FIG. 3B is an enlarged view of FIG. 3A, and shows a portion to be subjected to the trimming. The one-dot chain line represents a region of the pellicle film 101 that is exposed by the etching performed on the substrate 105 from the opposite surface (by the back-etching performed on the substrate 105). FIG. 3A shows a position at which a frame-shaped pressure-sensitive adhesive sheet 106 is bonded. The pressure-sensitive adhesive sheet 106 is not limited to being frame-shaped and may cover a top surface of the pellicle film 101. The trimming shown in FIG. 2C is performed as follows. First, as shown in FIG. 3B, a pressure-sensitive adhesive sheet is bonded to each of two surfaces of the substrate 105 so as to cover a cut line L along which the substrate 105 and the pellicle film 101 are to be cut. Namely, the pressure-sensitive adhesive sheet 106 is bonded to the top surface of the pellicle film 101. Although not shown in FIG. 3A or FIG. 3B, a pressure-sensitive adhesive sheet 307 is bonded to a bottom surface of the substrate 105 (see FIG. 4A through FIG. 4C). The pressure-sensitive adhesive sheets 106 and 107 are elastic and have a pressure-sensitive adhesive force thereof decreased upon receipt of external stimulation. The term "elastic" refers to having a tensile strength of 10 MPa or greater when having a Young's modulus is 100 MPa to 600 MPa and an elasticity of 20 to 40%. The "external stimulation" refers to ultraviolet light. The external stimulation is not limited to ultraviolet light and may be heat or the like.

There is no specific limitation on the material of the pressure-sensitive adhesive sheets 106 and 107. The pressure-sensitive adhesive sheet 106 and 107 may each be, for example, a sheet including a substrate film and a pressure-sensitive adhesive layer formed thereon. The substrate film may be any of a wide range of conventionally known substrate films, and may be, for example, a general-purpose polymer film such as a polyolefin-based film, an elastomer-based film or the like. Specific examples of material usable for the general-purpose polymer film include ethylene-based copolymers such as polyethylene, ethylene-vinyl acetate copolymer and the like; and general-purpose polymers such as polypropylene, polybutylene, ionomer; polybutadiene, polyethyleneterephthalate, polybutyleneterephthalate, polymethylpentene, polyurethane, and the like.

Figure 4A:
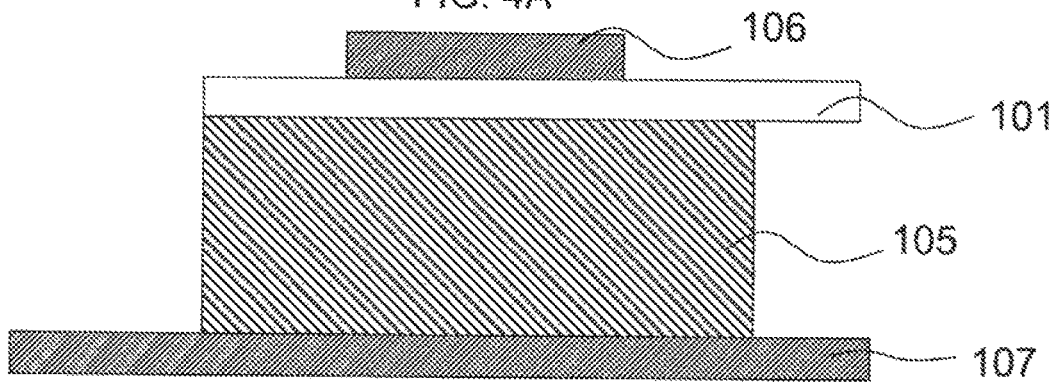
FIG. 4A is a schematic view showing, in detail, a step of trimming in the method for producing the pellicle-attached photomask in embodiment 1.
Figure 4B:
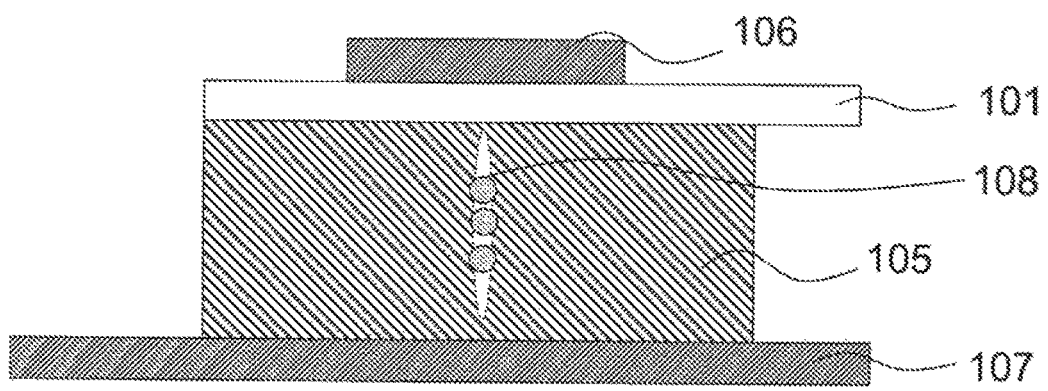
FIG. 4B is a schematic view showing, in detail, the step of trimming in the method for producing the pellicle-attached photomask in embodiment 1.
Figure 4C:
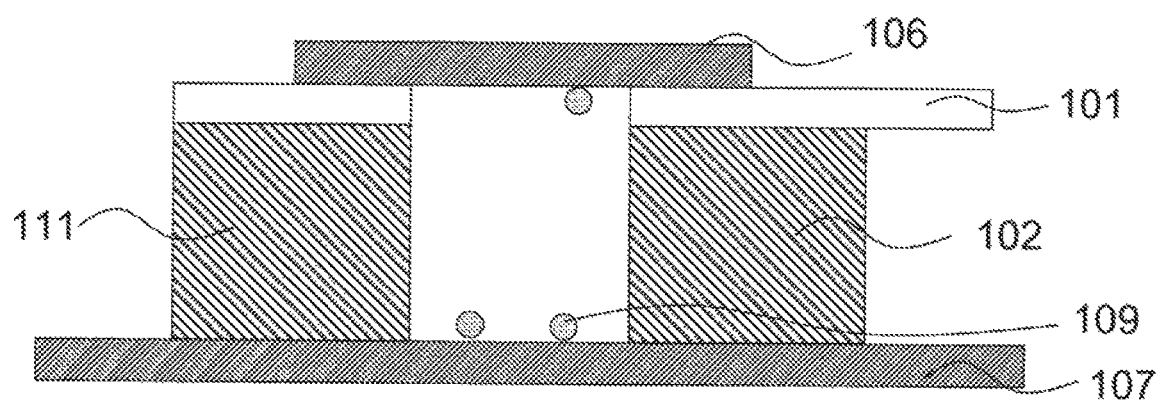
FIG. 4C is a schematic view showing, in detail, the step of trimming in the method for producing the pellicle-attached photomask in embodiment 1.

The pressure-sensitive adhesive layer may be formed of any of a wide range of conventionally known pressure-sensitive adhesives, and may be formed of, for example, an acrylic resin-based pressure-sensitive adhesive. Specific examples of usable acrylic resin-based pressure-sensitive adhesive include acrylic resin-based polymers such as polymers having an acrylic acid ester as a polymer structural unit, acrylic acid ester-based copolymers, and the like; copolymers with functional monomers; and mixtures of such polymers. It is preferable to use, for a pressure-sensitive adhesive layer, an ultraviolet-curable or thermally curable pressure-sensitive adhesive. In the case where the pressure-sensitive adhesive layer is ultraviolet-curable or thermally curable, the following occurs. For peeling off the pressure-sensitive adhesive sheet, the pressure-sensitive adhesive layer may be cured by being irradiated with ultraviolet or being heated. Thus, the pressure-sensitive adhesive force of the pressure-sensitive adhesive layer is decreased, and thus the pressure-sensitive adhesive sheet is peeled off with no influence on the pellicle film or the pellicle frame. In FIG. 4A through FIG. 4C, the pressure-sensitive adhesive sheet 107 is bonded to the entirety of the bottom surface of the substrate 105. Alternatively, the pressure-sensitive adhesive sheet 107 may be bonded in any manner as long as being located to face the pressure-sensitive adhesive sheet 106.

FIG. 4A through FIG. 4C are schematic views showing a step of trimming in detail in the method for producing the pellicle-attached photomask in embodiment 1. FIG. 4A corresponds to a cross-section taken along line B-B in FIG. 3B. As shown in FIG. 4A, the pressure-sensitive adhesive sheets 106 and 107 are bonded to both of the two surfaces of the substrate 105. As described above, the pressure-sensitive adhesive sheets 106 and 107 are bonded to cover both of two surfaces of the portion including the cut line along which the cutting is to be performed for the trimming. In FIG. 4A, the pressure-sensitive adhesive sheet 106 is bonded to a part of the top surface of the substrate 105. The pressure-sensitive adhesive sheet 106 may be bonded in any manner as long as covering the cut line.

Next, a notch 108 is made inside the substrate 105 on which the pressure-sensitive adhesive sheets 106 and 107 are bonded (FIG. 4B). Since merely the notch 108 is made inside in the substrate 105, no dust is generated from the surface of the substrate 105. The notch 108 may be made in the substrate 105 by, for example, stealth dicing. Any other method may be used as long as the notch 108 is made inside the substrate 105. According to the "stealth dicing", laser light is focused and directed to the inside of a processing target to form a quality-modified region inside the processing target along a line along which the processing target is to be cut. Then, the processing target is cut using the quality-modified region as a start point.

Next, the substrate 105 is expanded (pulled) together with the pressure-sensitive adhesive sheet 107 (FIG. 4C). When the substrate 105 and the pressure-sensitive adhesive sheet 107 are expanded, the substrate outer peripheral portion 111 is separated and thus the pellicle frame 102 is formed. When the substrate outer peripheral portion 111 is separated, foreign object particles 109 located in the notch inside the substrate 105 scatter as dust. However, the foreign object particles 109 are captured by the pressure-sensitive adhesive sheets 106 and 107. The expansion may be made by pushing the substrate 105 with a rod-like item from below the pressure-sensitive adhesive sheet 107. Alternatively, the pressure-sensitive adhesive sheet 107 may be expanded horizontally. Still alternatively, the pressure-sensitive adhesive sheet 106 may be expanded together with the pressure-sensitive adhesive sheet 107. At the time of expansion, the foreign object particles 109 may be absorbed by a vacuum (absorption device) from above the pressure-sensitive adhesive sheet 106. In the case of being absorbed by the vacuum in this manner, the foreign object particles 109 are easily captured by the pressure-sensitive adhesive sheet 106 or absorbed into the vacuum. In order to allow the generated foreign object particles 109 to be captured by the pressure-sensitive adhesive sheets efficiently, static electricity may be removed by an ionizer or the like at the time of, or after, the expansion. Alternatively, one of the pressure-sensitive adhesive sheets bonded to both of the two surfaces may be first peeled off, so that the cut surface is seen, and then the foreign object particles 109 may be absorbed by the vacuum, or a gas current may be supplied to allow the pressure-sensitive adhesive sheets to capture the foreign object particles 109. For peeling off one of the pressure-sensitive adhesive sheets, external stimulation may be given to one of the pressure-sensitive adhesive sheets, or two different types of pressure-sensitive adhesive sheets that are different in the release force (release temperature) may be used, for example.

Figure 4D:
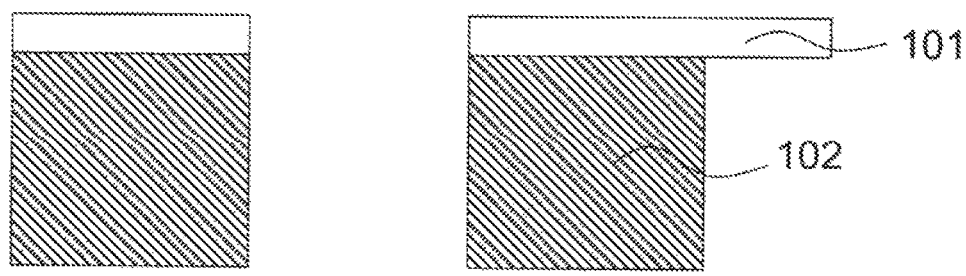
FIG. 4D is a schematic view showing, in detail, the step of trimming in the method for producing the pellicle-attached photomask in embodiment 1.

In a final step, the pressure-sensitive adhesive sheet 106 and the pressure-sensitive adhesive sheet 107 are irradiated with ultraviolet light to have the pressure-sensitive adhesive force thereof decreased. Then, the pressure-sensitive adhesive sheet 106 is peeled off from the pellicle film 101, and the pressure-sensitive adhesive sheet 107 is peeled off from the pellicle frame 102 (FIG. 4D). In FIG. 4A through FIG. 4D, the pellicle frame 102 is formed by trimming after the back-etching. In the case where the back-etching is performed after the trimming, the pressure-sensitive adhesive sheets 106 and 107 may be bonded to cover both of the two surfaces of the portion including a line along which the cut is to be performed at the time of trimming, and the pressure-sensitive adhesive sheets 106 and 107 may be peeled off as shown in FIG. 4A through FIG. 4D after the trimming and then the back-etching may be performed to expose the pixel film 101.

Figure 7A:
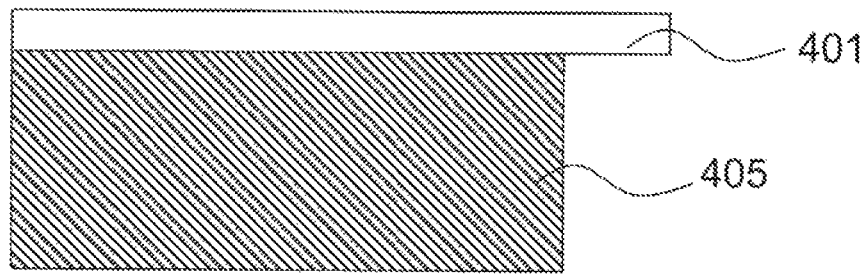
FIG. 7A is a schematic view showing a method of performing trimming by mechanically breaking a substrate.
Figure 7B:
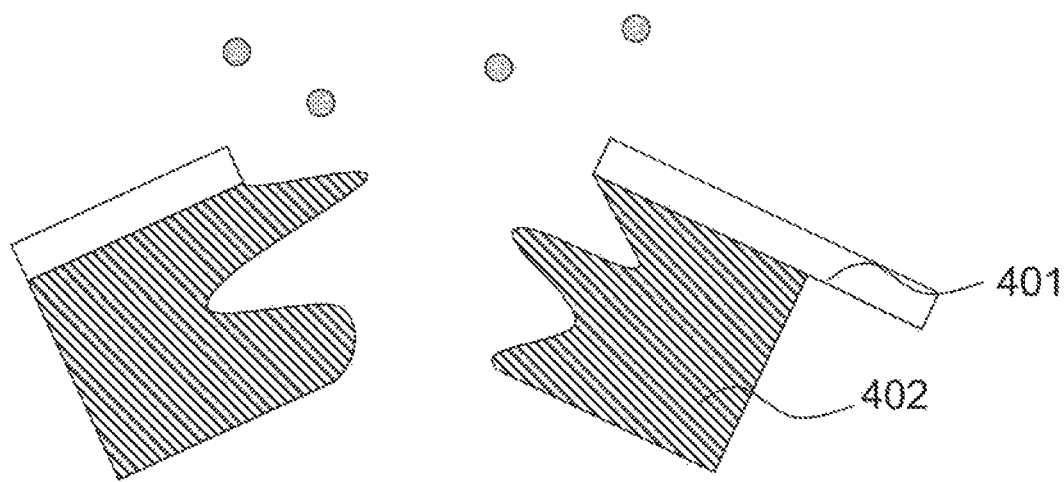
FIG. 7B is a schematic view showing the method of performing trimming by mechanically breaking the substrate.
Figure 7C:
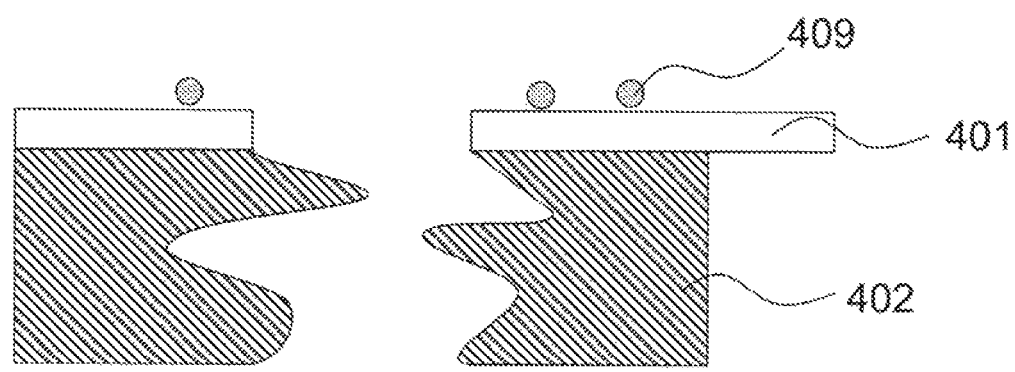
FIG. 7C is a schematic view showing the method of performing trimming by mechanically breaking the substrate.

In this embodiment, as compared with the conventional method of applying a mechanical force for the trimming, the foreign object particles, generated at the time of trimming to separate a portion of the substrate that is required to form the pellicle frame, are suppressed from being attached. This will be described in more detail. With the conventional method of applying a mechanical force for the trimming, as shown in FIG. 7A through FIG. 7C, foreign object particles 409 are generated when a substrate 405 is cut, and are attached to a pellicle film 401 or a pellicle frame 402. By contrast, in this embodiment, as described above with reference to FIG. 4C, the foreign object particles 109 are captured by the pressure-sensitive adhesive sheets 106 and 107, and thus are suppressed from being attached to the pellicle film 101.

Figure 8A:
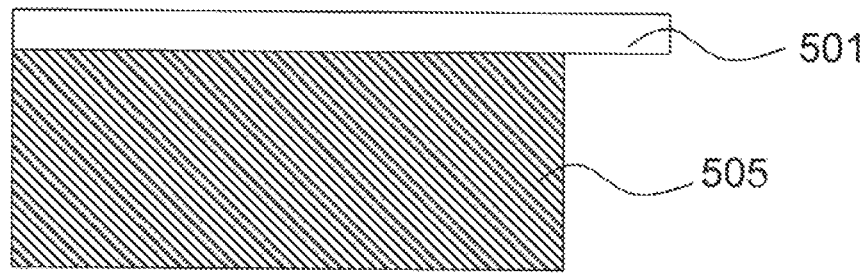
FIG. 8A is a schematic view showing a method of performing trimming by blade dicing or laser ablation.
Figure 8B:
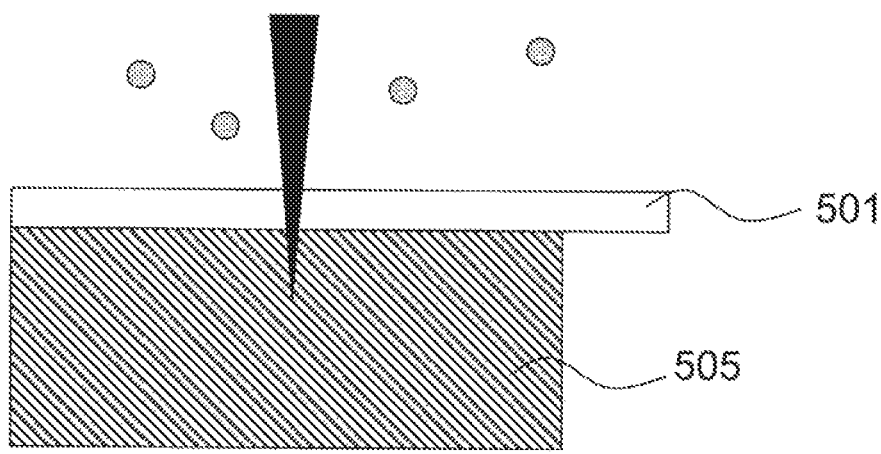
FIG. 8B is a schematic view showing the method of performing trimming by blade dicing or laser ablation.
Figure 8C:
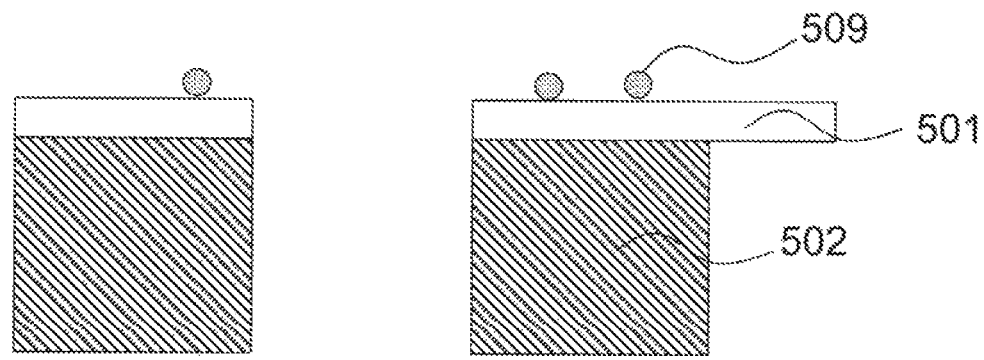
FIG. 8C is a schematic view showing the method of performing trimming by blade dicing or laser ablation.
Figure 9A:
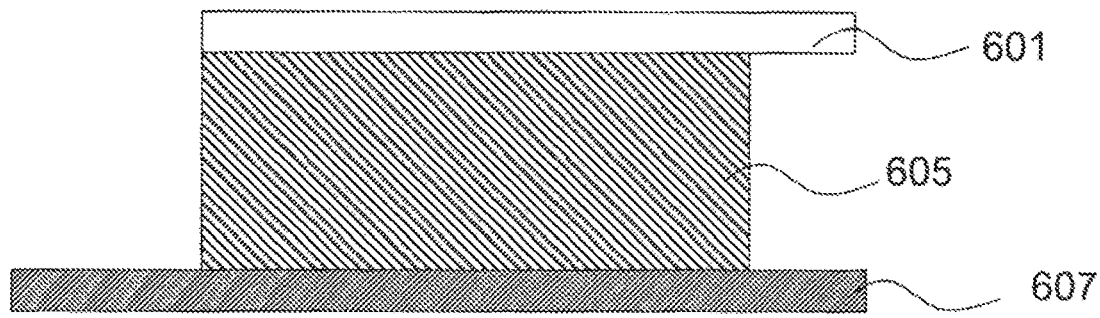
FIG. 9A is a schematic view showing a method of performing trimming by stealth dicing.
Figure 9B:
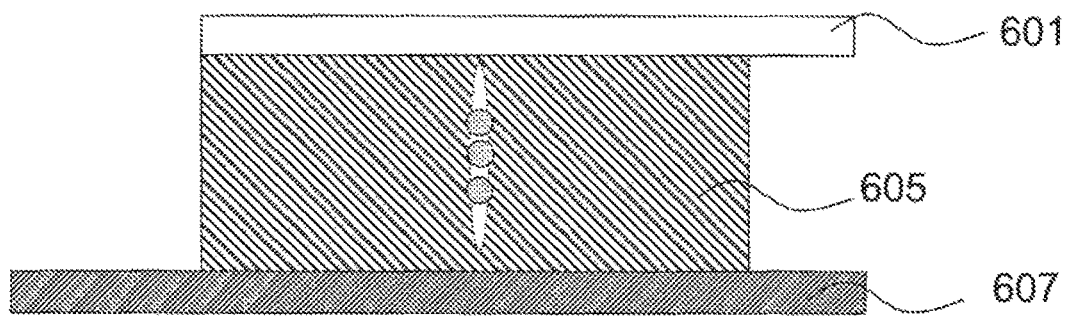
FIG. 9B is a schematic view showing the method of performing trimming by stealth dicing.
Figure 9C:
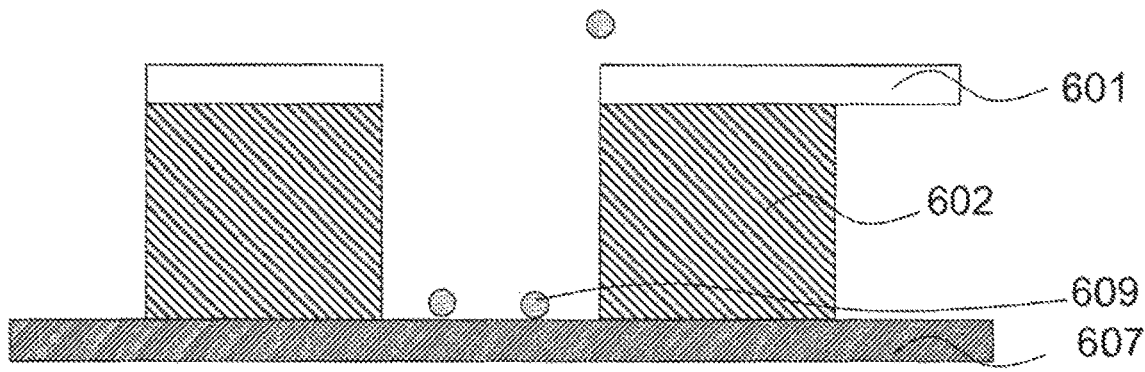
FIG. 9C is a schematic view showing the method of performing trimming by stealth dicing.
Figure 9D:
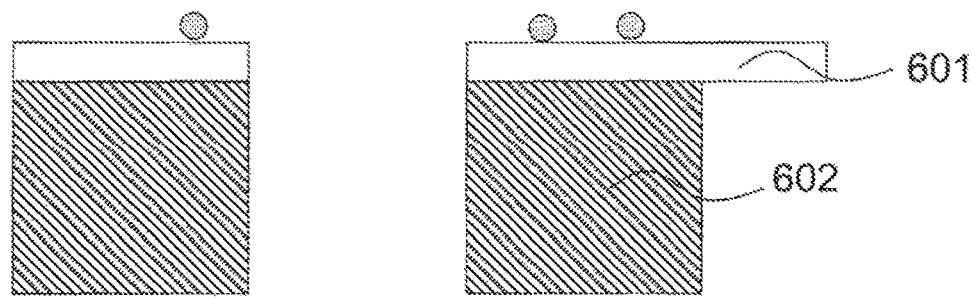
FIG. 9D is a schematic view showing the method of performing trimming by stealth dicing.

There are other methods for improving the trimming in addition to the method in this embodiment. For example, as shown in FIG. 8A through FIG. 8C, the substrate may be trimmed by blade dicing or laser ablation. However, these methods do not avoid generation of foreign object particles 509 while the substrate 505 is cut. As a result, the foreign object particles 509 are attached to a pellicle film 501 or a pellicle frame 502, and thus the pellicle is contaminated.

According to another method, the above-described stealth dicing may be used. With this method, no notch is made in the surface of the pellicle, which is a processing target. Therefore, on the stage of forming a quality-modified region inside the substrate, no foreign object particle is generated. However, as shown in FIG. 9A through FIG. 9D, foreign object particles 609 scatter as dust on the stage of expanding (pulling) a substrate 605 and a pressure-sensitive adhesive sheet 607 using the quality-modified region as a start point. Therefore, even with the stealth dicing, the foreign object particles 609 are attached to a pellicle film 601 or a pellicle frame 602, and thus the pellicle is contaminated.

In this embodiment, a path through which the foreign object particles 109 scatter outside is blocked by the pressure-sensitive adhesive sheets 106 and 107 more than by the above-described other trimming methods. Therefore, the foreign object particles 109 are suppressed from being attached to the pellicle film 101 or the pellicle frame 102.

Embodiment 2

Described in embodiment 2 is a method for bonding pressure-sensitive adhesive sheets in the case where a portion of the substrate that is to be a pellicle frame and the substrate outer peripheral portion have, therebetween, an opening formed in advance and are coupled with each other via a bridge portion. In this example, a notch for the trimming merely needs to be made in the bridge portion.

Figure 5A:
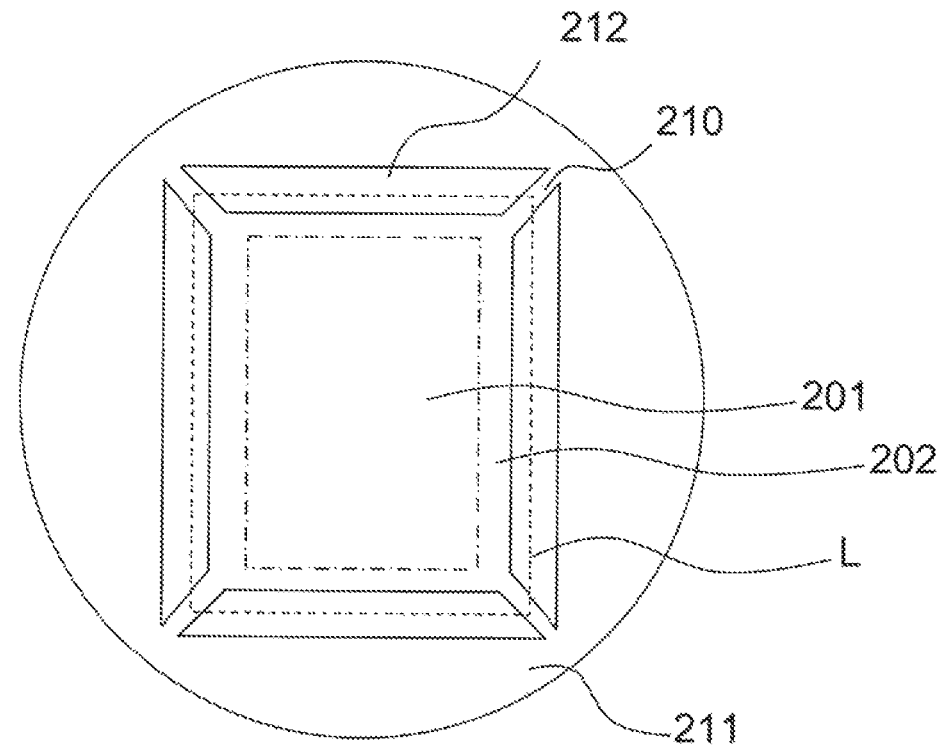
FIG. 5A is a schematic view showing positions at which pressure-sensitive adhesive sheets are bonded in embodiment 2.
Figure 5B:
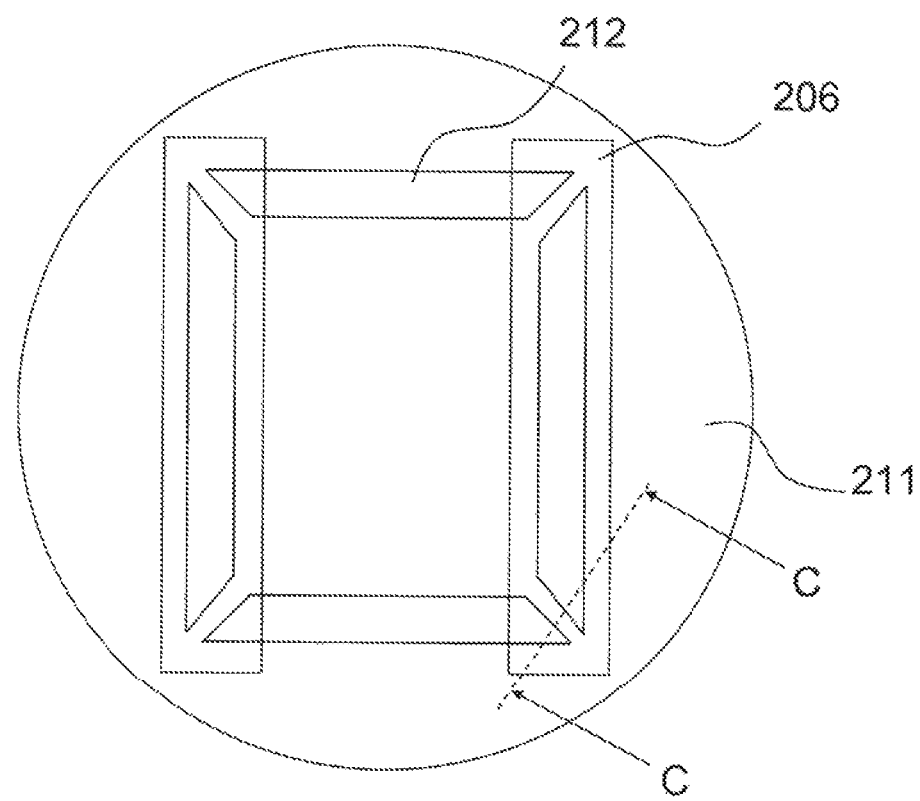
FIG. 5B is a schematic view showing the positions at which the pressure-sensitive adhesive sheets are bonded in embodiment 2.
Figure 5C:
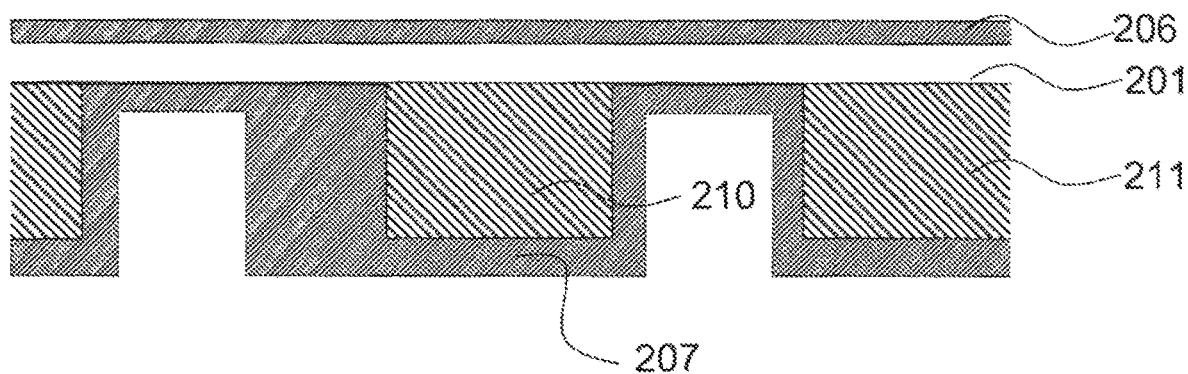
FIG. 5C is a cross-sectional view taken along line C-C in FIG. 5B.
Figure 5D:
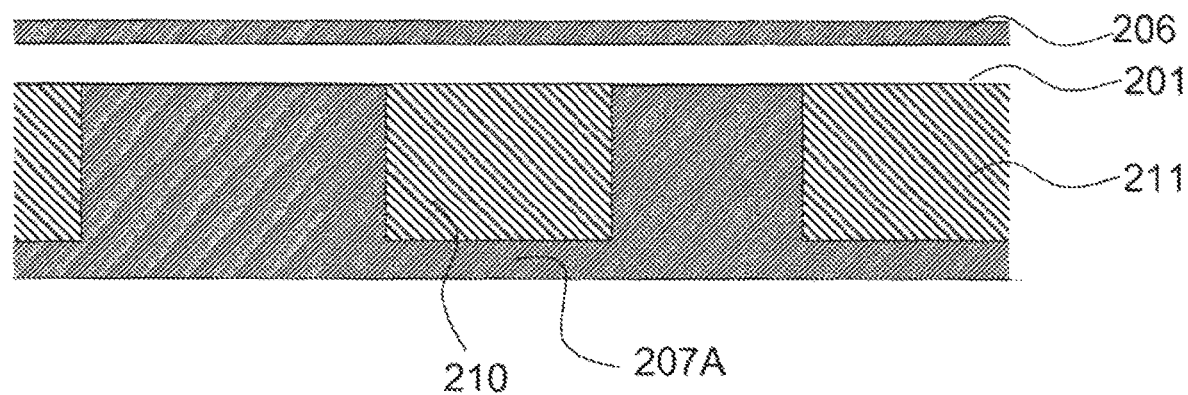
FIG. 5D shows a state where an opening shown in FIG. 5C is filled with the pressure-sensitive adhesive sheet.

FIG. 5A and FIG. 5B are plan views showing positions at which pressure-sensitive adhesive sheets are bonded in embodiment 2 according to the present invention. FIG. 5A shows a state with no pressure-sensitive adhesive sheet 206. FIG. 5B shows a state where the pressure-sensitive adhesive sheets 206 are bonded. FIG. 5C is a cross-sectional view taken along line C-C in FIG. 5B. A bridge portion 210 is connected to each of four corners of a portion of the substrate that is to be pellicle frame 202. Openings 212 are provided between the portion of the substrate that is to be pellicle frame 202 and the substrate outer peripheral portion 211, and the portion of the substrate that is to be pellicle frame 202 and a substrate outer peripheral portion 211 are coupled with each other via the bridge portions 210. Pressure-sensitive adhesive sheets 206 and 207 are bonded to cover both of two surfaces and both two side surfaces of each of the bridge portions 210. The pressure-sensitive adhesive sheets may be bonded along the openings 212 over the bridge portions, or as shown in FIG. 5D, a pressure-sensitive adhesive sheet 207A may be bonded such that a pressure-sensitive adhesive thereof fills each opening 212. In this example, one pressure-sensitive adhesive sheet 206 covers two bridge portions 210.

After the pressure-sensitive adhesive sheets 206 and 207 (or 207A) are bonded, a notch is made inside each of the bridge portions at the four corners. The notch is made along a direction perpendicular to the direction in which the bridge portion 210 extends (e.g., the notch is made in the direction of line C-C). Then, the pressure-sensitive adhesive sheet 207 or 207A and the bridge portions 210 are expanded to separate the bridge portions 210, so that the pellicle frame is formed. After this, the pressure-sensitive adhesive sheets 206 and 207 (or 207A) are irradiated with ultraviolet light to be peeled off. Thus, the trimming is finished.

Embodiment 3

In embodiment 3, the structure of the substrate is the same as that in embodiment 2. The pressure-sensitive adhesive sheets are bonded in a different manner.

Figure 6A:
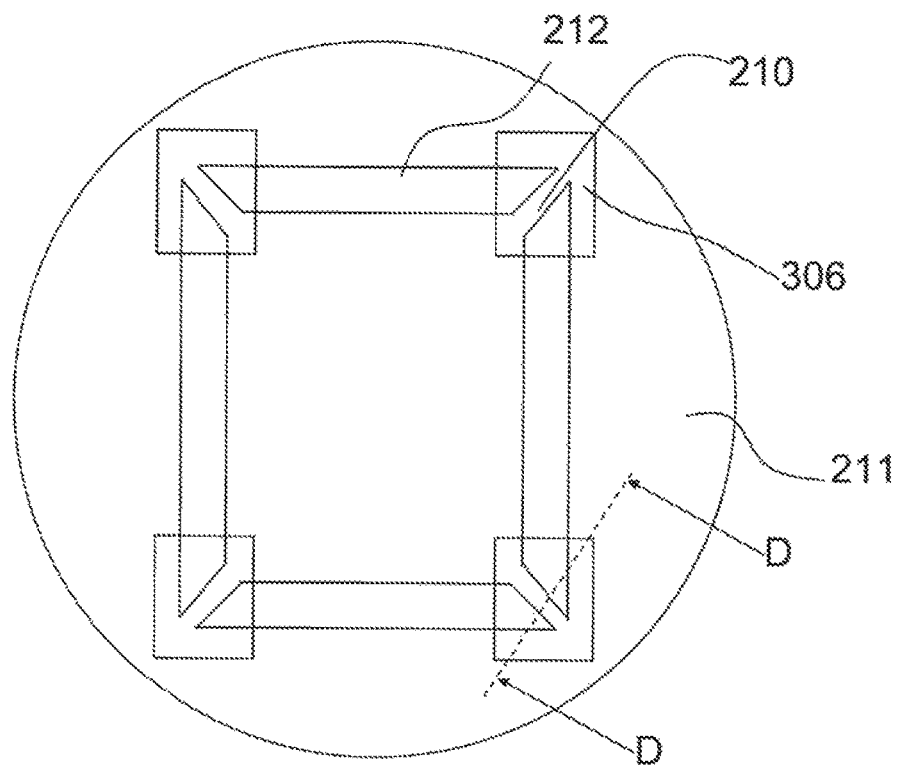
FIG. 6A is a schematic view showing positions at which pressure-sensitive adhesive sheets are bonded in embodiment 3.
Figure 6B:
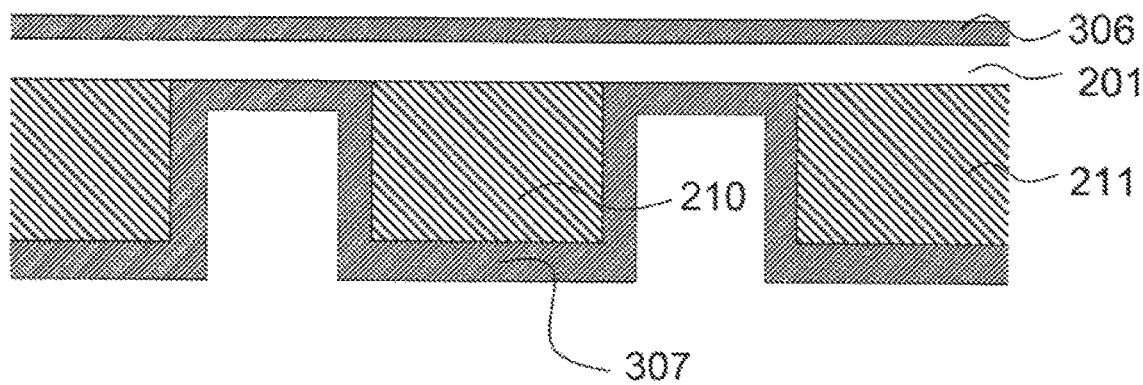
FIG. 6B is a cross-sectional view taken along line D-D in FIG. 6A.
Figure 6C:
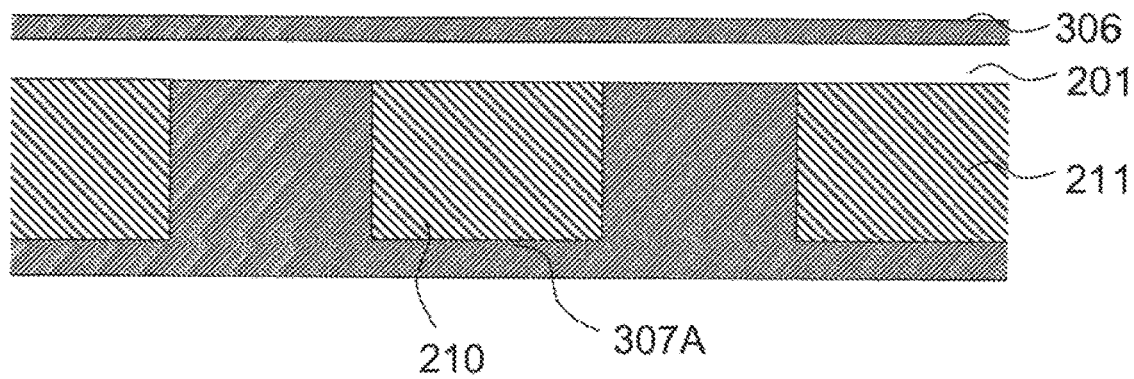
FIG. 6C shows a state where an opening shown in FIG. 6B is filled with the pressure-sensitive adhesive sheet.

FIG. 6A is a plan view showing positions at which pressure-sensitive adhesive sheets are bonded in embodiment 3 according to the present invention. FIG. 6B is a cross-sectional view taken long line D-D in FIG. 6A. Like in embodiment 2, pressure-sensitive adhesive sheets 306 and 307 are bonded to cover both of two surfaces and both two side surfaces of each of the bridge portions 210. In this embodiment, one pressure-sensitive adhesive sheet 306 and one pressure-sensitive adhesive sheet 307 cover each of the bridge portions 210. The pressure-sensitive adhesive sheets may be bonded along openings 212 over the bridge portions 210, or as shown in FIG. 6C, a pressure-sensitive adhesive sheet 307A may be bonded such that a pressure-sensitive adhesive thereof fills each opening 212. The method for separation and the like are substantially the same as those in embodiment 2 and will not be described here.

What is claimed is:

1. A method for producing a pellicle including a pellicle film and a pellicle frame supporting an outer peripheral portion of the pellicle film, the method comprising:
    forming the pellicle film on a substrate, and bonding a pressure-sensitive adhesive sheet to each of the pellicle film on the substrate and a surface of the substrate opposite to a surface on which the pellicle film is formed, the pressure-sensitive adhesive sheet being elastic and having a pressure-sensitive adhesive force thereof decreased upon receipt of external stimulation;
    making a notch inside a part of the substrate, the part having the pressure-sensitive adhesive sheets bonded thereto;
    separating a substrate outer peripheral portion outer to the notch of the substrate, in a state where the pressure-sensitive adhesive sheets are bonded to each of the pellicle film on the substrate and the surface of the substrate opposite to the surface on which the pellicle film is formed, to form the pellicle frame; and stimulating the pressure-sensitive adhesive sheets to peel off the pressure-sensitive adhesive sheets.

2. The method for producing a pellicle according to claim 1, further comprising etching the substrate, from the surface of the substrate opposite to the surface on which the pellicle film is formed, to expose the pellicle film.

3. The method for producing a pellicle according to claim 1, wherein:

after the substrate is etched, from the surface of the substrate opposite to the surface on which the pellicle film is formed, to expose the pellicle film, the pressure-sensitive adhesive sheet is bonded to each of the two surfaces of a portion of the substrate that is around the exposed portion of the pellicle film.

4. The method for producing a pellicle according to claim 1, wherein:

the substrate has openings provided between a portion of the substrate to be a pellicle frame and the substrate outer peripheral portion and includes a bridge portion coupling the portion of the substrate to be a pellicle frame and the substrate outer peripheral portion to each other; and making the notch inside the substrate is making the notch inside the bridge portion.

5. The method for producing a pellicle according to claim 4, wherein the pressure-sensitive adhesive sheets are bonded to cover both of two surfaces and both of two side surfaces of the bridge portion.

6. The method for producing a pellicle according to claim 4, wherein the bridge portion is connected to each of four corners of the pellicle frame.

7. The method for producing a pellicle according to claim 1, wherein the notch is made inside the substrate by stealth dicing.

8. The method for producing a pellicle according to claim 1, wherein the pressure-sensitive adhesive sheets are antistatic.

9. The method for producing a pellicle according to claim 1, wherein for separating the substrate outer peripheral portion to form the pellicle frame, gas in a portion along which the substrate is separated is absorbed by an absorption device.

10. The method for producing a pellicle according to claim 1, wherein the pellicle film has a thickness of 10 nm or greater and 50 nm or less.

11. A method for producing a pellicle-attached photomask, comprising:

forming the pellicle film on a substrate, and bonding a pressure-sensitive adhesive sheet to each of the pellicle film on the substrate and a surface of the substrate opposite to a surface on which the pellicle film is formed, the pressure-sensitive adhesive sheet being elastic and having a pressure-sensitive adhesive force thereof decreased upon receipt of external stimulation;

making a notch inside a part of the substrate, the part having the pressure-sensitive adhesive sheets bonded thereto;

separating a substrate outer peripheral portion outer to the notch of the substrate, in a state where the pressure-sensitive adhesive sheets are bonded to each of the pellicle film on the substrate and the surface of the substrate opposite to the surface on which the pellicle film is formed, to form the pellicle frame; and stimulating the pressure-sensitive adhesive sheets to peel off the pressure-sensitive adhesive sheets;

joining the pellicle and a photomask, to each other via a frame body attached to the pellicle frame.

12. The method for producing a pellicle-attached photomask according to claim 11, further comprising etching the substrate, from the surface of the substrate opposite to the surface on which the pellicle film is formed, to expose the pellicle film.

13. The method for producing a pellicle-attached photomask according to claim 11, wherein:

after the substrate is etched, from the surface of the substrate opposite to the surface on which the pellicle film is formed, to expose the pellicle film, the pressure-sensitive adhesive sheet is bonded to each of the two surfaces of a portion of the substrate that is around the exposed portion of the pellicle film.

14. The method for producing a pellicle-attached photomask according to claim 11, wherein:

the substrate has openings provided between a portion of the substrate to be a pellicle frame and the substrate outer peripheral portion and includes a bridge portion coupling the portion of the substrate to be a pellicle frame and the substrate outer peripheral portion to each other; and making the notch inside the substrate is making the notch inside the bridge portion.

15. The method for producing a pellicle-attached photomask according to claim 14, wherein the pressure-sensitive adhesive sheets are bonded to cover both of two surfaces and both of two side surfaces of the bridge portion.

16. The method for producing a pellicle-attached photomask according to claim 14, wherein the bridge portion is connected to each of four corners of the pellicle frame.

17. The method for producing a pellicle-attached photomask according to claim 11, wherein the notch is made inside the substrate by stealth dicing.

18. The method for producing a pellicle-attached photomask according to claim 11, wherein the pressure-sensitive adhesive sheets are antistatic.

19. The method for producing a pellicle-attached photomask according to claim 11, wherein for separating the substrate outer peripheral portion to form the pellicle frame, gas in a portion along which the substrate is separated is absorbed by an absorption device.

20. The method for producing a pellicle-attached photomask according to claim 11, wherein the pellicle film has a thickness of 10 nm or greater and 50 nm or less.

* * * * *